United States Patent
Tran

(10) Patent No.: US 8,301,964 B2
(45) Date of Patent: Oct. 30, 2012

(54) INCREMENTAL REDUNDANCY WITH RESEGMENTATION

(75) Inventor: Phat Tran, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 1143 days.

(21) Appl. No.: 11/942,152

(22) Filed: Nov. 19, 2007

(65) Prior Publication Data
US 2009/0128377 A1 May 21, 2009

(51) Int. Cl.
*H03M 13/00* (2006.01)
*H04L 1/18* (2006.01)
*H04L 1/00* (2006.01)
*H04L 12/58* (2006.01)

(52) U.S. Cl. ........ 714/755; 714/748; 714/749; 714/750; 714/751; 714/752; 714/758; 714/774; 714/800; 370/216; 370/218; 370/236; 370/392

(58) Field of Classification Search .................. 714/755, 714/751, 748, 750, 774, 749, 800, 798, 758, 714/752; 370/216, 218, 236, 335, 392
See application file for complete search history.

(56) References Cited

U.S. PATENT DOCUMENTS

| | | | | |
|---|---|---|---|---|
| 5,181,207 A * | 1/1993 | Chapman | ...................... | 714/755 |
| 6,430,230 B1 * | 8/2002 | Cunningham et al. | ........ | 375/292 |
| 6,430,721 B2 * | 8/2002 | Kajala et al. | ................. | 714/752 |
| 6,453,440 B1 * | 9/2002 | Cypher | ......................... | 714/758 |
| 6,473,880 B1 * | 10/2002 | Cypher | ......................... | 714/800 |
| 6,738,779 B1 * | 5/2004 | Shapira | ......................... | 707/747 |
| 6,977,888 B1 * | 12/2005 | Frenger et al. | ................. | 370/218 |
| 7,506,238 B2 * | 3/2009 | Hocevar | ......................... | 714/781 |
| 7,650,560 B2 * | 1/2010 | Mo et al. | ........................ | 714/790 |
| 2003/0014709 A1 | 1/2003 | Miyoshi | | |
| 2001/0034209 A1 | 10/2007 | Tong | | |
| 2009/0049363 A1 * | 2/2009 | Hocevar | ......................... | 714/758 |

FOREIGN PATENT DOCUMENTS
WO   WO-0223792   3/2002

OTHER PUBLICATIONS

Hu, Xiaoyun, First Office Action for CA 2,643,542, May 10, 2011.
Papantoniou, Antonis, Third Exam Report for EP 07121044.7, Mar. 28, 2011.
Papantoniou, Antonis , Second Examination Report for EP 07121044.7, Mar. 18, 2009.
Papantoniou, Antonis , Third Exam Report for EP 07121044.7, Mar. 18, 2010.
Papantoniou, Antonis , Extended European Search Report for EP 07121044.7, May 6, 2008.
Extended European Search Report for European patent application EP07121044.7, filed Nov. 19, 2007.

* cited by examiner

*Primary Examiner* — John J Tabone, Jr.
(74) *Attorney, Agent, or Firm* — Integral Intellectual Property Inc.; Miriam Paton

(57) ABSTRACT

Different transmissions based on different content blocks which were segmented from the same digital content according to different segmentation schemes, where each of the content blocks has any substring in common with at least one of the other content blocks, are received by a receiving radio communication station, for example a mobile telephone or a mobile network base station. Certain encoded received bits derived from different ones of the transmissions are combined into combined bits. Other encoded received bits derived from one or more of the different transmissions are provided together with the combined bits to a decoder.

31 Claims, 8 Drawing Sheets

INCREMENTAL REDUNDANCY WITH RESEGMENTATION

BACKGROUND

Enhanced General Packet Radio Service (EGPRS), also known as Enhanced Data rates for GSM Evolution (EDGE), is a digital mobile telephone technology that allows data transmission rates to be increased and improves data transmission reliability.

Two types of an error control method known as Automatic Repeat-reQuest (ARQ) are used in EGPRS, as described in 3GPP TS 43.064—$3^{rd}$ Generation Partnership Project; Technical Specification Group GERAN; Digital cellular telecommunications system (Phase 2+); General Packet Radio Service (GPRS); Overall description of the GPRS radio interface; Stage 2 (Release 5). When a block of data has not been correctly received, the sending entity resends the block of data. The sending entity may be the network or a mobile telephone. The receiving entity may be the network or a mobile telephone. In the first type, blocks of coded data that the receiving entity is unable to successfully decode are resegmented and retransmitted. The receiving entity decodes each retransmission in isolation from the previous transmissions. In the second type, Type II Hybrid ARQ, also known as incremental redundancy (IR), if the receiving entity is unable to successfully decode a block of coded data, that block is retransmitted using a different puncturing scheme. The received bits from the different transmissions are combined to aid the decoding.

It is expected that blocks are not resegmented when using incremental redundancy. Indeed, the EGPRS specifications provide for a "resegment" bit in ARQ control to prevent resegmentation when the network employs incremental redundancy.

BRIEF DESCRIPTION OF THE DRAWINGS

Embodiments are illustrated by way of example and not limitation in the figures of the accompanying drawings, in which like reference numerals indicate corresponding, analogous or similar elements, and in which.

It will be appreciated that for simplicity and clarity of illustration, elements shown in the figures have not necessarily been drawn to scale. For example, the dimensions of some of the elements may be exaggerated relative to other elements for clarity.

DETAILED DESCRIPTION

In the following detailed description, numerous specific details are set forth in order to provide a thorough understanding of embodiments. However it will be understood by those of ordinary skill in the art that the embodiments may be practiced without these specific details. In other instances, well-known methods, procedures, components and circuits have not been described in detail so as not to obscure the embodiments.

Figure 1:
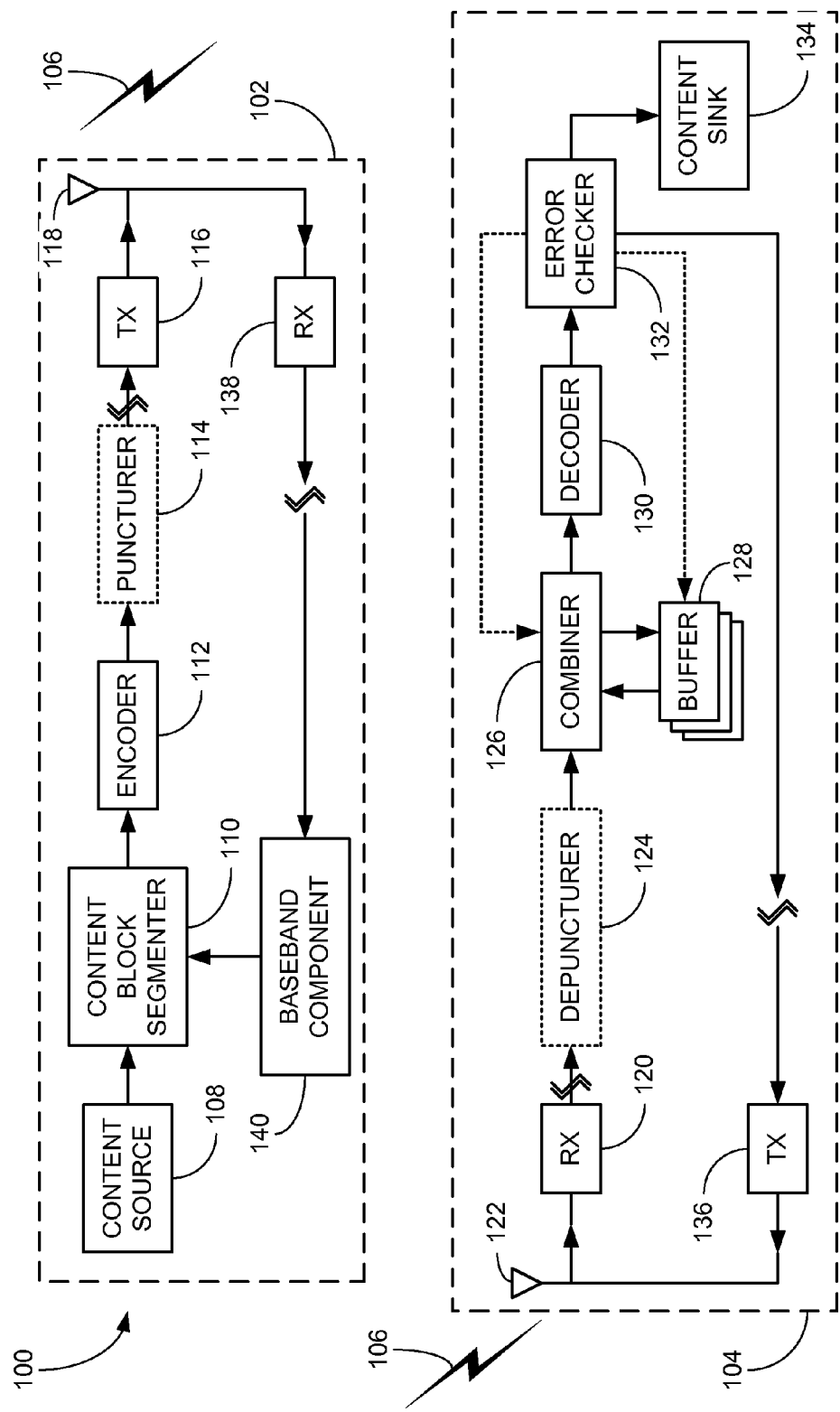
FIG. 1 is a block diagram of an exemplary radio communication system.

FIG. 1 is a block diagram of an exemplary radio communication system 100. System 100 comprises a communication station 102 and a communication station 104 able to communicate over radio communication channels 106. In the following description, communication station 102 acts as a sending station and communication station 104 acts as a receiving station. For example, station 102 may be a mobile network base station and station 104 may be a mobile telephone, and transmissions from station 102 to station 104 are considered to be downlink communications. However, the following description is equally applicable to uplink communications, which would be the case, for example, if station 104 were a mobile network base station and station 102 were a mobile telephone. It should be noted that the mobile telephone may have additional capabilities and may use the mobile network to transmit and/or receive non-telephonic data.

Station 102 comprises a content source 108 that produces digital content. The digital content is segmented into blocks by a content block segmenter 110 according to a particular block segmentation scheme. In some contexts, the content block is known as the payload. Prefix bits and suffix bits are appended to each content block, and the content block with appended bits is then encoded by an encoder 112 according to a particular coding scheme. For example, encoder 112 may use a convolutional code without recursiveness.

The encoded block is then punctured by a puncturer 114 according to a particular puncturing scheme. For example, each third bit of the encoded block may be deleted. The output of puncturer 114 is referred to as channel bits, which are provided to a transmitter 116. As is known in the art, transmitter 116 puts the channel bits into a form that permit their communication upon radio frequency (RF) channels and cause the communication of the channel bits upon the RF channels via an antenna 118. For example, transmitter 116 may comprise upconverters, modulators, a power amplifier, and other components.

Figure 2A:
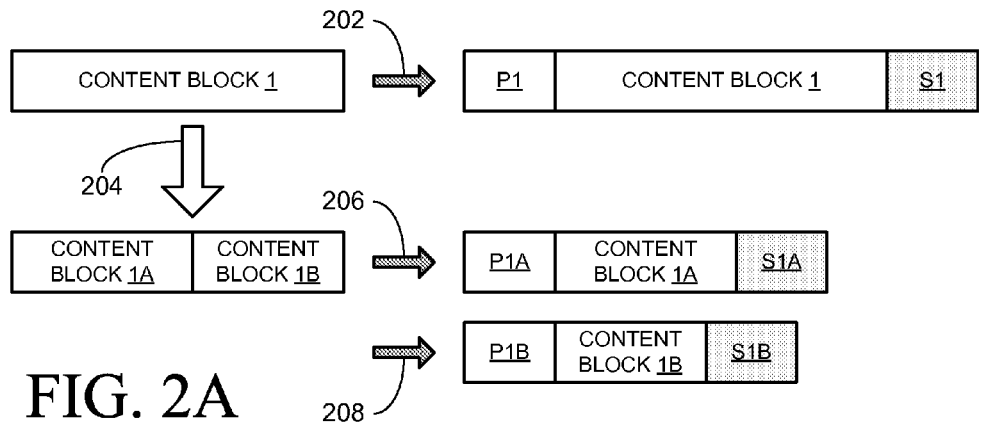
FIGS. 2A and 2B are illustrations of different exemplary segmentations of digital content into content blocks and the appending of prefix bits and suffix bits to the content blocks.
Figure 2B:
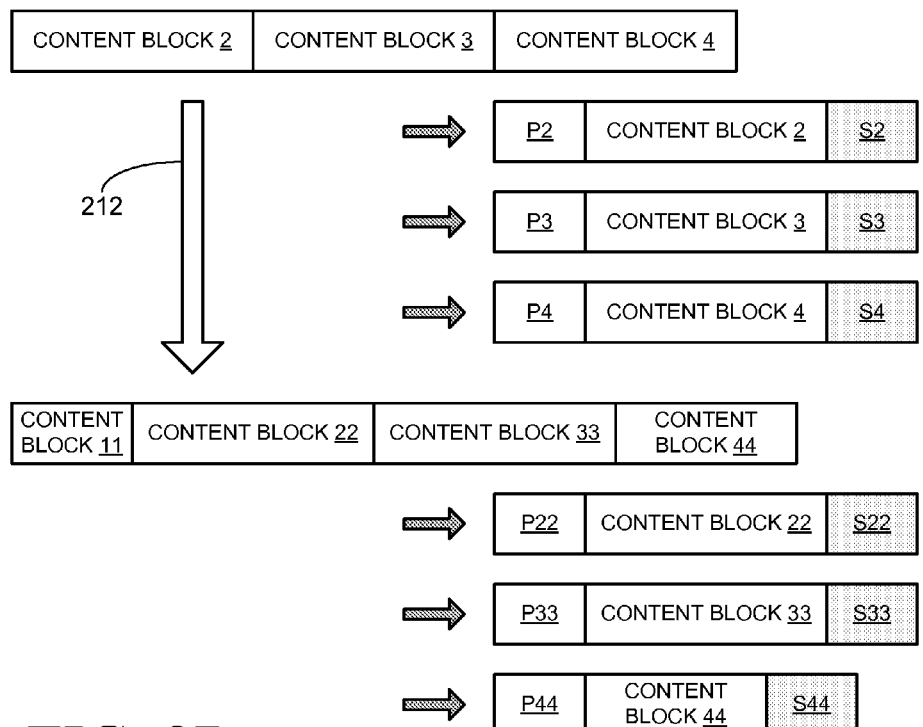

Briefly, FIGS. 2A and 2B are illustrations of different exemplary segmentations of digital content into content blocks and the appending of prefix bits and suffix bits to the content blocks. FIG. 2A shows a content block 1, which prior to encoding, has appended to it (as indicated by an arrow 202) with prefix bits P1 and suffix bits S1. A different segmentation of the same digital content into two separate content blocks, content block 1A and content block 1B, is indicated by an arrow 204. Content block 1 is identical to a concatenation of content block 1A and content block 1B. Content block 1A is a proper substring of content block 1, i.e. content block 1A is wholly contained in content block 1. Likewise, content block 1B is a proper substring of content block 1. Moreover, no portion of content block 1 is common to content block 1A and content block 1B, i.e. content block 1A and content block 1B are non-overlapping. For example, content block 1 may comprise 256 bits of digital content, content block 1A may comprise the first 128 bits of that digital content and content block 1B may comprise the second 128 bits of the digital content. Resegmentation of a single content block into two non-overlapping content blocks of equal size (or in a few cases, almost equal size), each of which is a proper substring of the single content block, and the reverse case (concatenation of two equal-sized content blocks into a single content block) are the only forms of resegmentation permitted in the EGPRS specification. Prior to encoding, content block 1A has appended to it (as indicated by an arrow 206) prefix bits P1A and suffix bits S1A, which differ from prefix bits P1 and suffix bits S1, respectively. Likewise, prior to encoding, content block 1B has appended to it (as indicated by an arrow 208) prefix bits P1B and suffix bits S1B, which differ from prefix bits P1 and suffix bits S1, respectively. The prefix bits in EDGE are just a couple of bits of control information that, for some reason, were not included in the header of the content block. The number of suffix bits depends on the size of the cyclic redundancy check (CRC). Even if content block 1A and content block 1B are identical, prefix bits P1A could differ from prefix bits P1B, and suffix bits S1A could differ from suffix bits S1B.

FIG. 2B shows content blocks 2, 3 and 4 and an exemplary resegmentation (indicated by an arrow 212) of the digital content of those blocks into content blocks 11, 22, 33 and 44. Content block 11 comprises a portion of the digital content of content block 2. Content block 22 comprises portions of the digital content of content blocks 2 and 3. Content block 33 comprises portions of the digital content of content blocks 3 and 4. Content block 44 comprises a portion of the digital content of content block 4 and a portion of the digital content of another content block (not shown). The segmentation of the digital content into content blocks 2, 3, and 4 results in the appending of prefix bits P2, P3, and P4, respectively, and of suffix bits S2, S3, and S4, respectively, to those content blocks prior to encoding. Likewise, the segmentation of the digital content into content blocks 11, 22, 33 and 44 results in the appending of prefix bits and suffix bits to those content blocks prior to encoding. Content block 22 has appended to it prefix bits P22 and suffix bits P22, which differ from prefix bits P2 and suffix bits S2, respectively. Content block 33 has appended to it prefix bits P33 and suffix bits P33, which differ from prefix bits P3 and suffix bits S3, respectively. Content block 44 has appended to it prefix bits P44 and suffix bits P44, which differ from prefix bits P4 and suffix bits P4, respectively.

Figure 3:
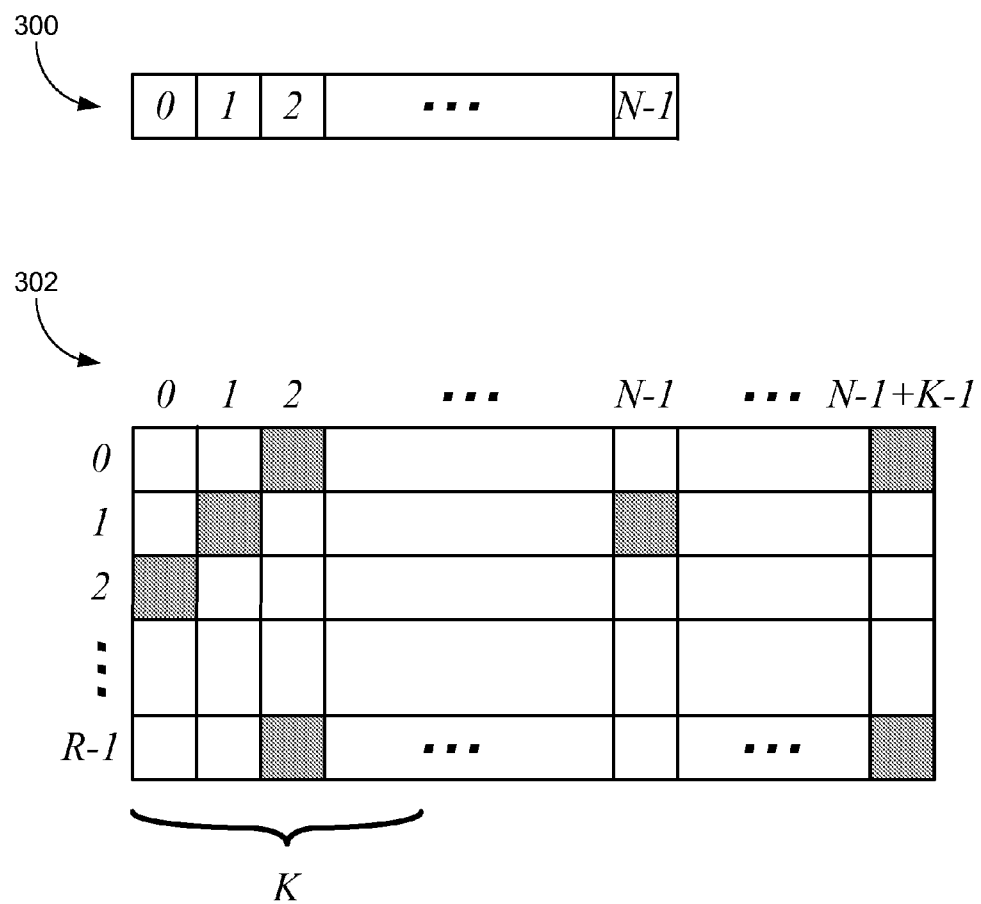
FIG. 3 is an illustration of an exemplary block of data and the matrix of encoded bits generated therefrom.

Briefly, FIG. 3 is an illustration of an exemplary block of data and the matrix of encoded bits generated therefrom. A block 300 has N bits, which includes the prefix bits, the bits of the content block, and the suffix bits. In the example shown in FIG. 3, a convolutional code with a constraint length K and a rate of 1/R is used by encoder 112 to encode block 300. A convolutional code of rate 1/R has R generator polynomials, $G_0, G_1, \ldots, G_{R-1}$, and encoder 112 produces a matrix 302 of encoded bits with R rows, each row i being the output of generator polynomial $G_i$. In general, the value of the $m^{th}$ bit in block 300 affects the values of the encoded bits in columns m through m+K-1 of matrix 302, where m is an index that runs from 0 to N-1.

Consider, for example, that the first 4 bits of block 300 are prefix bits, and that the last 6 bits of block 300 are suffix bits. Then the bits of columns 0 through 3+K-1 are all affected by the prefix bits, and the bits of columns N-6 through N-1+K-1 are all affected by the suffix bits. However, the bits of columns 4+K-1 through N-7 are unaffected by the prefix bits or the suffix bits.

Puncturing is the process of deleting bits of encoded data to reduce the data transmitted. For example, the puncturing scheme used by puncturer 114 may delete every third bit of matrix 302, starting at the top left corner and counting the bits column by column. The deleted bits are indicated in FIG. 3 as shaded boxes of matrix 302. Although in this description, puncturing and depuncturing are performed in stations 102 and 104, respectively, the technology described herein is equally applicable to cases where no puncturing or depuncturing is performed.

Returning to FIG. 1, station 104 comprises a receiver 120 to detect RF signals via an antenna 122 and to downconvert the received signals to baseband levels. Additional operations not separately illustrated are performed. For example, soft decision operations are also performed on the received data. For example, the output of the soft decision operator may be that there is a 45% probability that a particular received bit is a 1 and a 55% probability that the particular received bit is a 0. Although in this description, soft decision operations are performed on the received data in station 104, the technology described herein is equally applicable to cases where hard decision operations are performed on the received data in station 104 prior to depuncturing and/or combining.

The soft received bits are provided to a depuncturer 124, which inserts erasures at the appropriate locations in the stream of received bits to fill in the gaps created by puncturer 114. The output of depuncturer 124 may be considered a matrix similar to matrix 302 of FIG. 3, in which each matrix element that was deleted by puncturer 114 is replaced by an erasure and each matrix element that was not deleted by puncturer 114 is replaced by a soft decision regarding a received bit.

The output of depuncturer 124, possibly combined by a combiner 126 with selected contents of one or more buffers 128, is provided to an error-correcting decoder 130. Decoder 130 attempts to decode its input and corrects any errors which can be corrected. If there are too many errors, they cannot be corrected. An error checker 132 checks whether decoder 130 was successful in decoding the received block. If so, the successfully decoded bits are provided to upper layers, represented as a content sink 134. The combination of the output of depuncturer 124 with the selected contents of one or more of buffers 128 may occur before each decoding, or may only occur after a first decoding attempt without combining is unsuccessful. One reason to make a first decoding attempt without combining is that the selected contents of one or more of buffers 128 may be of such poor decodability that combining the selected contents with the output of depuncturer 124 may impair the decoding of the output of depuncturer 124. Methods of combining used by combiner 126 may include, for example, numerical summation of soft decisions for corresponding bits or averaging of a corresponding stored soft decision value with a new soft decision value.

System 100 implements a feedback scheme so that sending station 102 is informed whether transmissions of encoded data to receiving station 104 are successfully decoded. For example, an ACK/NACK (acknowledgment/negative acknowledgment) scheme may be used, where a positive acknowledgment, ACK, is generated at station 104 and transmitted to station 102 in the event that the output of decoder 130 is accepted by error checker 132, and where a negative acknowledgement, NACK, is generated at station 104 and transmitted to station 102 in the event that the output of decoder 130 is rejected by error checker 132. Therefore, station 104 has a transmitter 136 which enables the ACK/NACK indication to be transmitted to station 102 via antenna 122. The ACK/NACK indication is received in station 102 via antenna 118 by a receiver 138. In another example, positive acknowledgment may be assumed unless a negative acknowledgment is received by station 102 within a certain period of time following transmission of the encoded data. In that example, only NACKs are generated at station 104 and transmitted to station 102 when appropriate. In yet another example, negative acknowledgment may be assumed if a positive acknowledgment has not been received by station 102 within a certain period of time following transmission of the encoded data. In that example, only ACKs are generated at station 104 and transmitted to station 102 when appropriate.

Receipt of a NACK indication may result in a retransmission by station 102 of the content block that was not successfully received by station 104. Rather than retransmitting the same content block with a different puncturing scheme, one or more different content blocks may be transmitted, where the digital content of the content block that was not successfully received is comprised in the one or more different content blocks. In other words, the detected NACK indication is provided to a baseband component 140, which may change how content block segmenter 110 segments the digital content.

It should be noted that resegmentation is just one possible response to receipt of a NACK indication. In the event that the sending entity chooses to resegment, the technology described herein allows incremental redundancy combining to be used to improve decodability. For example, consider the case where, due to excessive errors, first encoded received bits derived from a first transmission cannot be decoded by an error-correcting decoder. If the sending entity chooses to resegment, second encoded received bits may be derived from a second transmission, where the first transmission is based on a first content block segmented from digital content according to a first block segmentation scheme and the second transmission is based on a second content block segmented from the same digital content according to a second block segmentation scheme that differs from the first scheme, and where the first content block and the second content block have a substring in common. It may happen that, due to excessive errors, the second encoded received bits also cannot be decoded by an error-correcting decoder. However, if the technology described herein is implemented, combining into combined bits selected ones of the first encoded received bits and corresponding selected ones of the second encoded received bits, where the correspondence is based on the encoded bits being related to the same portion of the substring, may counteract the effect of some of the errors. Therefore, providing the others of the first encoded received bits along with the combined bits to the error-correcting decoder may enable successful decoding, which means that the bits of the first content block can be accurately determined. Likewise, providing the others of the second encoded received bits along with the combined bits to the error-correcting decoder may enable successful decoding, which means that the bits of the second content block can be accurately determined.

Various tests could be designed to check whether the technology described herein has been implemented and is operating properly. A stream of encoded bits could be designed to have so many errors that it cannot be successfully decoded by an error-correcting decoder. In one test, for example, two such streams are designed, each stream representing a different content block segmented from the same digital content according to a different segmentation scheme, where the two content blocks have a substring in common. Each of the streams designed for the test represents a content block in the sense that it represents the received encoded bits that would be the output of a process involving appending prefix bits and suffix bits to that content block, encoding the block having the appended bits, possibly puncturing the encoded block, transmission of the resultant channel bits over one or more RF channels, reception of RF signals, downconversion of the received RF signals to baseband levels, determination of encoded bits and possibly depuncturing. Although neither of the streams can, independently of the other, be successfully decoded by the error-correcting decoder, the streams are designed so that once combined, as described herein, the combined encoded bits together with the uncombined encoded bits of one of the streams can be successfully decoded by the error-correcting decoder, thus enabling the accurate determination of the bits of the content block that was represented by that stream.

Any appropriate resegmentation scheme may be used. For example, the digital content of the content block that was not successfully received may be divided into two or more smaller content blocks, each of which is a proper substring of the original content block and none of which overlap. In another example, the digital content of the content block that was not successfully received may be concatenated with other digital content and included in a single content block. In yet another example, the digital content of the content block that was not successfully received may be included in two or more other content blocks, not all of which or none of which are proper substrings of the original content block.

When resegmentation is employed, the prefix bits and the suffix bits appended to the new content block(s) are not identical to the prefix bits and the suffix bits appended to the original content block, as explained hereinabove with respect to FIGS. 2A and 2B. Consequently, even if the new content block is a proper substring of the original content block, and both blocks, after having prefix bits and suffix bits appended thereto, are encoded using a convolutional code at the same rate 1/R and the same constraint length K, the bits in columns of the resulting matrices of encoded bits that are affected by the prefix bits and/or by the suffix bits will be different, as explained hereinabove with respect to FIG. 3.

In general, employing resegmentation means that the original content block and the new content block are not identical and have a "substring" of digital content in common. The new content block may be a proper substring of the original content block, or the original content block may be a proper substring of the new content block. It may be that the new content block is not a proper substring of the original content block and that the original content block is not a proper substring of the new content block. It may be that one of the content blocks (original or new) is a proper substring of the other content block, but that the complement of the substring in the other content block is not contiguous in the other content block.

It is generally accepted that the matrices of encoded received bits resulting from different segmentations of the same digital content are so different from one another that they must be decoded in isolation from one another. That is the reason that the EGPRS specifications provide for a "resegment" bit in ARQ control to prevent resegmentation when the network employs incremental redundancy. However, the inventor has discovered that if the length of the substring in common between the differently segmented content blocks is at least as long as the constraint length K, then—barring any distortion due to the transmission over the radio channel and ignoring the effects of different puncturing schemes—the bits of at least one column in the matrix of encoded received bits for the original transmission ought to be identical to the bits of at least one column in the matrix of encoded received bits for the retransmission.

Combiner 126 may store the output of depuncturer 124 in buffer 128, either always or only if the output of decoder 130 is rejected by error checker 132. If the output of decoder 130 is accepted by error checker 132, error checker 132 may instruct buffer 128 to delete a stored block when all the content data in that block has been successfully decoded, in order to make room for storing other blocks. When receiving another transmission based on a content block at least a substring of which is identical to a substring of the content block on which the previously received block was based, combiner 126 will combine the received block after depuncturing with those portions of the buffer contents that were unaffected by the prefix bits and the suffix bits and any new content bits adjacent to the common content substring, thereby providing additional information to decoder 130. If error checker 132 still rejects the output of decoder 130, despite the additional information, then the combined block on which the decoding was done, or portions thereof, may be saved in buffer 128 for further combining with subsequent retransmissions. Saving the combined block in buffer 128 may overwrite previously stored copies of received blocks (or portions thereof) having substrings in common with the combined block. Alternatively, whole received blocks after depuncturing may be stored in buffer 128 in their entirety and combiner 126 may perform multi-way combinations of different overlapping substrings when a new block is received. This latter implementation may require significant memory and processing resources.

Columns of different received matrices are considered to correspond to one another if they represent the encoding of the same bits of digital content.

Figure 4A:
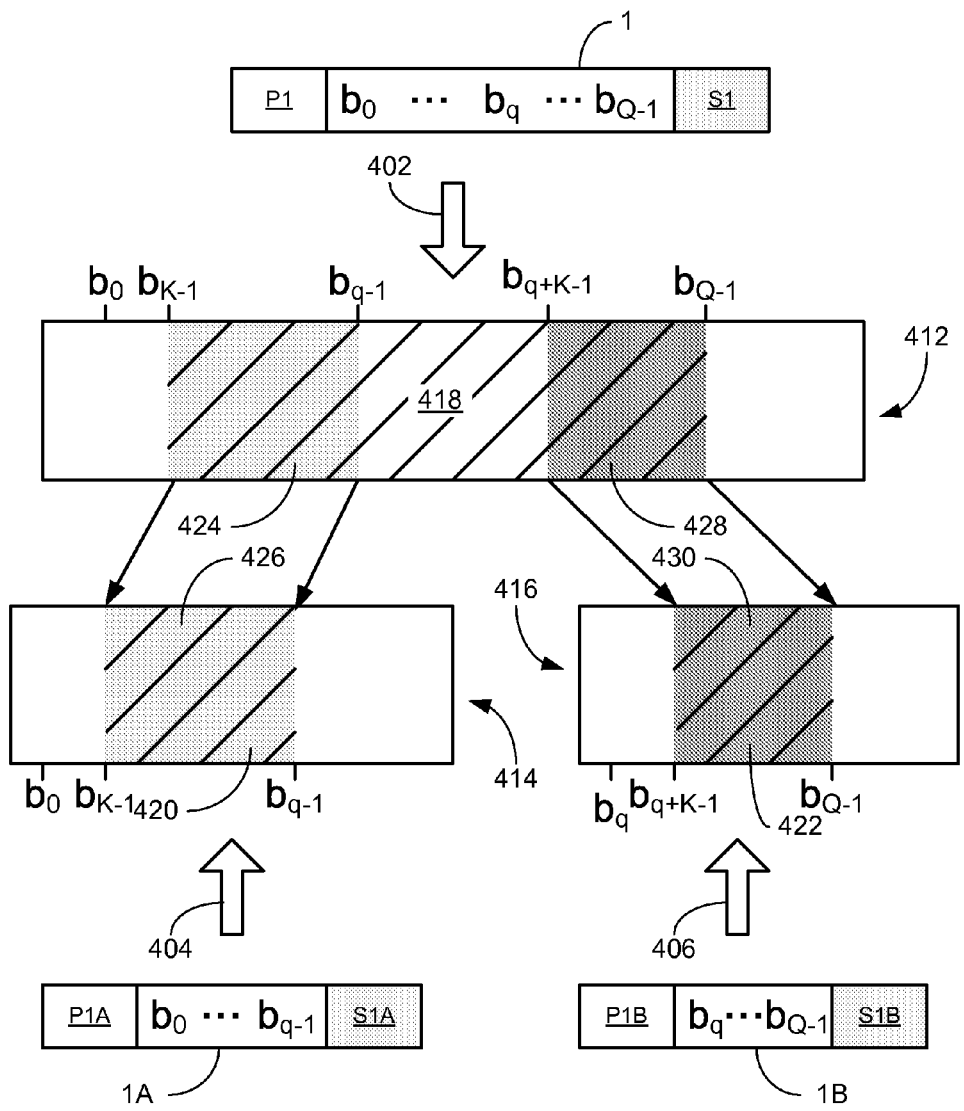
FIGS. 4A and 4B are illustrations of different exemplary received matrices.

FIG. 4A illustrates exemplary received matrices resulting from the encoding, puncturing, transmission, reception and downconverting of content blocks 1, 1A and 1B of FIG. 2A. Content blocks 1, 1A and 1B are shown in FIG. 4A with an indication of their content bits. Once the prefix bits and suffix bits are appended to content blocks 1, 1A, and 1B, the process of encoding, puncturing, transmission, reception and downconverting is indicated by arrows 402, 404 and 406, respectively.

A received matrix 412 corresponds to content block 1, a received matrix 414 corresponds to content block 1A, and a received matrix 416 corresponds to content block 1B. The "b" position markers on the matrices indicate the first column that the corresponding content bit "b" starts affecting the output. Note that this column would also be affected by the preceding K-1 bits of the segmented block, whether these bits are other content bits or prefix bits. Hatched columns 418 are the columns of matrix 412 that are unaffected by prefix bits P1 and/or suffix bits S1, for example, columns 20 through 240. Hatched columns 420 are the columns of matrix 414 that are unaffected by prefix bits P1A and/or suffix bits S1A, for example, columns 18 through 116. Hatched columns 422 are the columns of matrix 416 that are unaffected by prefix bits P1B and/or suffix bits S1B, for example, columns 22 through 112. Therefore lightly shaded columns 424 of matrix 412 and lightly shaded columns 426 of matrix 414 correspond to the same bits of digital content. Likewise, darkly shaded columns 428 of matrix 412 and darkly shaded columns 430 of matrix 416 correspond to the same bits of digital content. In this example, columns 420 and 426 are identical and columns 422 and 430 are identical.

Therefore, if decoder 130 is unable to successfully decode matrix 412, then when station 104 has received matrix 414, combiner 126 updates received matrix 414 so that each bit in columns 426 is replaced by a combination of the bit and the corresponding bit in columns 424. Then decoder 130 decodes updated matrix 414 and performs error correction, if possible. Likewise, when station 104 has received matrix 416, combiner 126 updates received matrix 416 so that each bit in columns 430 is replaced by a combination of the bit and the corresponding bit in columns 428. Then decoder 130 decodes updated matrix 416 and performs error correction, if possible. Alternatively, station 104 may attempt to decode matrix 414 and matrix 416 independently and may only combine one or both of those matrices with matrix 412 if the independent decoding is unsuccessful.

In the reverse case, where the initial transmissions resulted in the receipt of matrix 414, which was not successfully decoded, and the receipt of matrix 416, which was not successfully decoded, and the resegmentation and retransmission resulted in the receipt of matrix 412, then combiner 126 updates received matrix 412 so that each bit in columns 424 is replaced by a combination of the bit and the corresponding bit in columns 426, and so that each bit in columns 428 is replaced by a combination of the bit and the corresponding bit in columns 430. Then decoder 130 decodes updated matrix 412 and performs error correction, if possible. It should be noted that station 104 may combine matrix 414 and matrix 412 and perform decoding on the combined matrix even without the receipt of matrix 416. It should also be noted that station 104 may combine matrix 416 and matrix 412 and perform decoding on the combined matrix even without the receipt of matrix 414.

Figure 4B:
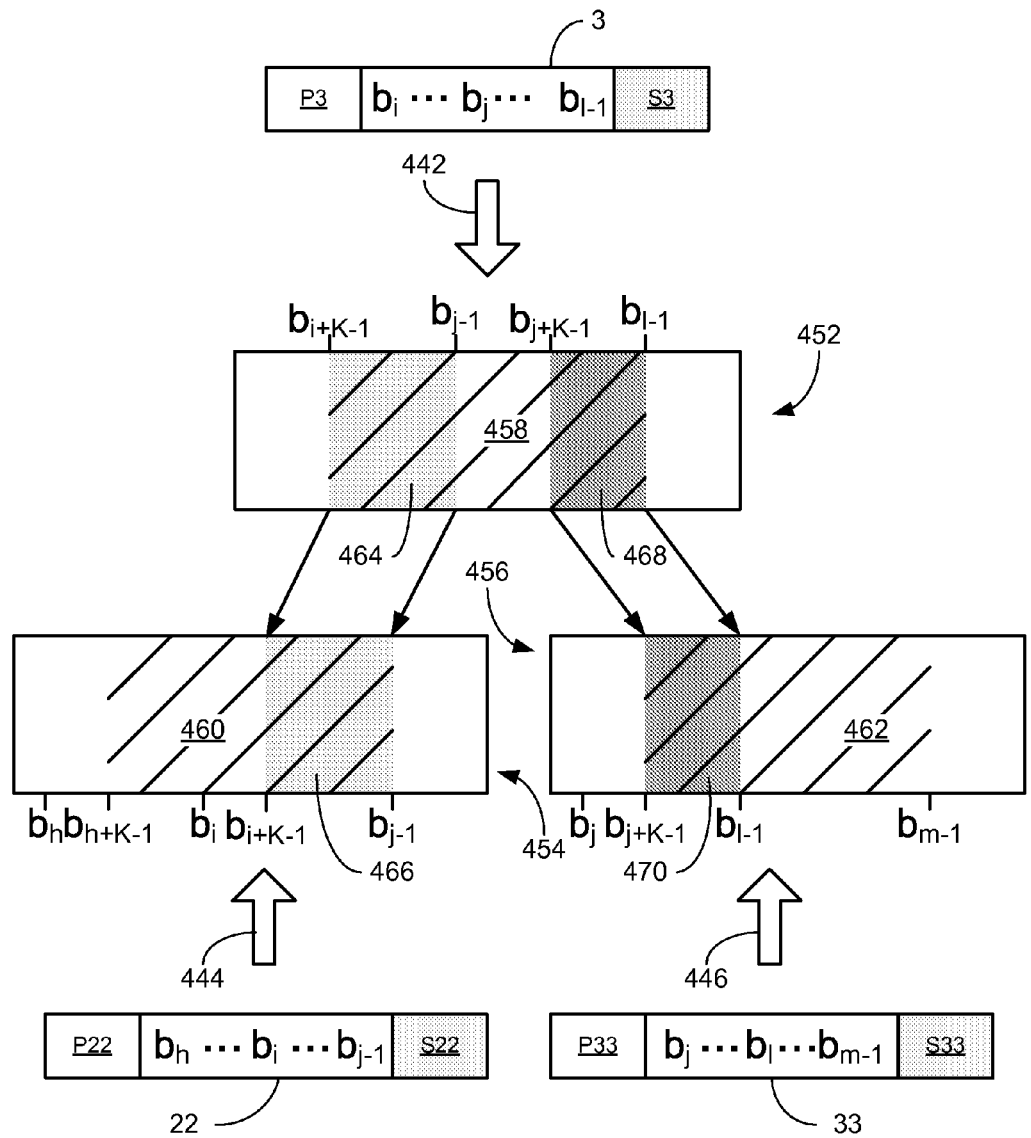

FIG. 4B illustrates exemplary received matrices resulting from the encoding, puncturing, transmission, reception and downconverting of content blocks 3, 22 and 33 of FIG. 2B. Content blocks 3, 22 and 33 are shown in FIG. 4B with an indication of their content bits. In this example, bit indices h, i, j, l and m satisfy the following condition: $h<i<j<l<m$. Once the prefix bits and suffix bits are appended to content blocks 3, 22 and 33, the process of encoding, puncturing, transmission, reception and downconverting is indicated by arrows 442, 444 and 446, respectively.

A received matrix 452 corresponds to content block 3, a received matrix 454 corresponds to content block 22, and a received matrix 456 corresponds to content block 33. Hatched columns 458 are the columns of matrix 452 that are unaffected by prefix bits P3 and/or suffix bits S3. Hatched columns 460 are the columns of matrix 454 that are unaffected by prefix bits P22 and/or suffix bits P22. Hatched columns 462 are the columns of matrix 456 that are unaffected by prefix bits P33 and/or suffix bits S33. However, only the latter part of content block 22 has digital content in common with content block 3, and only the initial part of content block 33 has digital content in common with content block 3. Therefore, only lightly shaded columns 464 of matrix 452 and lightly shaded columns 466 of matrix 454 correspond to the same bits of digital content. Likewise, only darkly shaded columns 468 of matrix 452 and darkly shaded columns 470 of matrix 456 correspond to the same bits of digital content.

Figure 5:
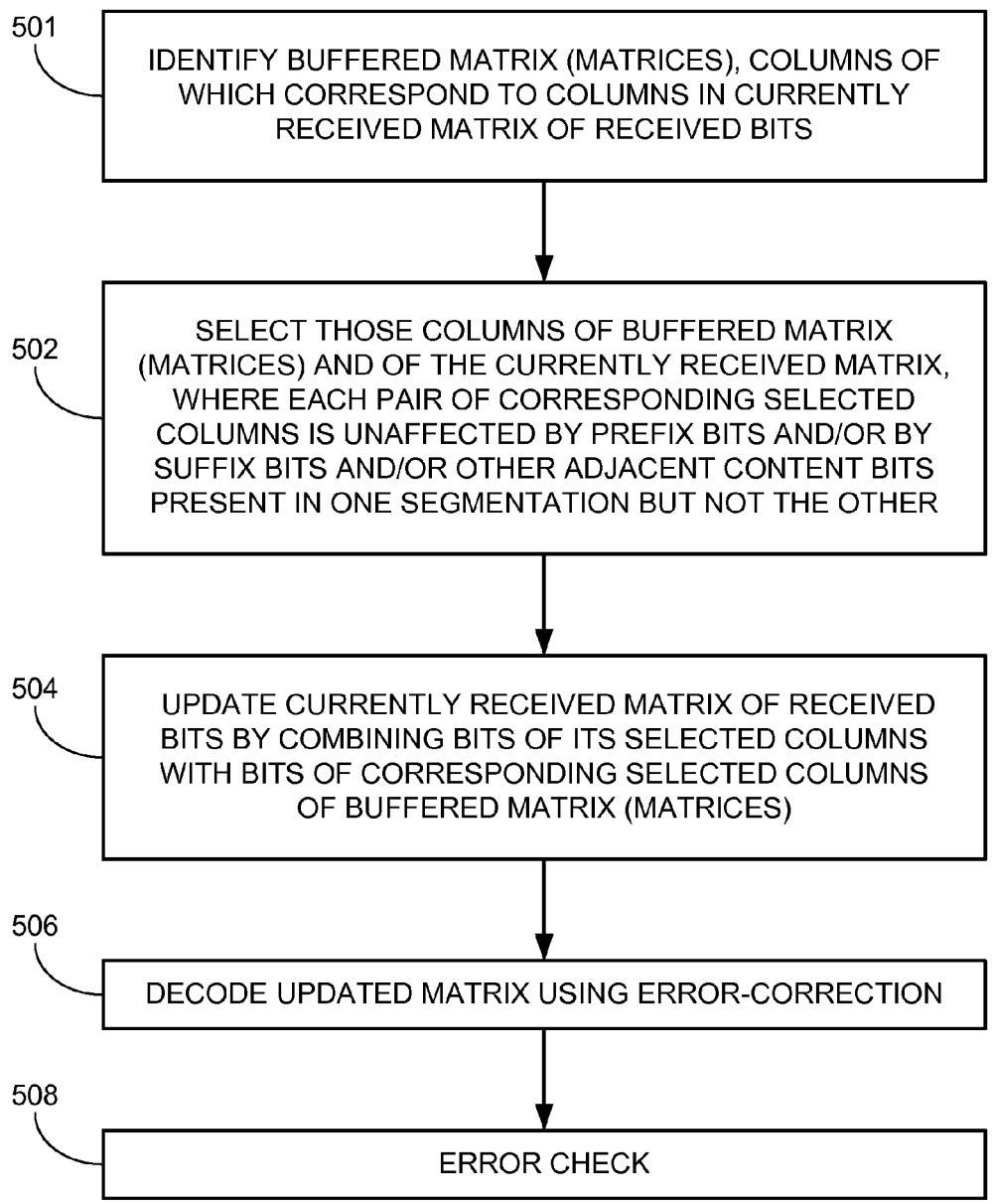
FIG. 5 is a flowchart of an exemplary method that may be implemented in a combiner, a decoder and an error checker.

FIG. 5 is a flowchart of an exemplary method that may be implemented in combiner 126, decoder 130 and error checker 132. At 501, combiner 126 identifies which buffered matrix (or matrices) has columns that correspond to columns in a currently received matrix of received bits. The correspondence of columns arises from the columns being related to the same bits of digital content. At 502, combiner 126 selects columns of the buffered matrix (or matrices) and of the currently received matrix of received bits, where each pair of corresponding selected columns is unaffected by prefix bits and/or by suffix bits and/or by other adjacent content bits present in one segmentation but not the other. At 504, combiner 126 updates the currently received matrix by combining bits of its selected columns with the bits of corresponding selected columns of the buffered matrix. At 506, the updated matrix is decoded using error-correction by decoder 130. At 508, error checker 132 checks whether decoder 130 has successfully decoded the updated matrix.

Figure 6:
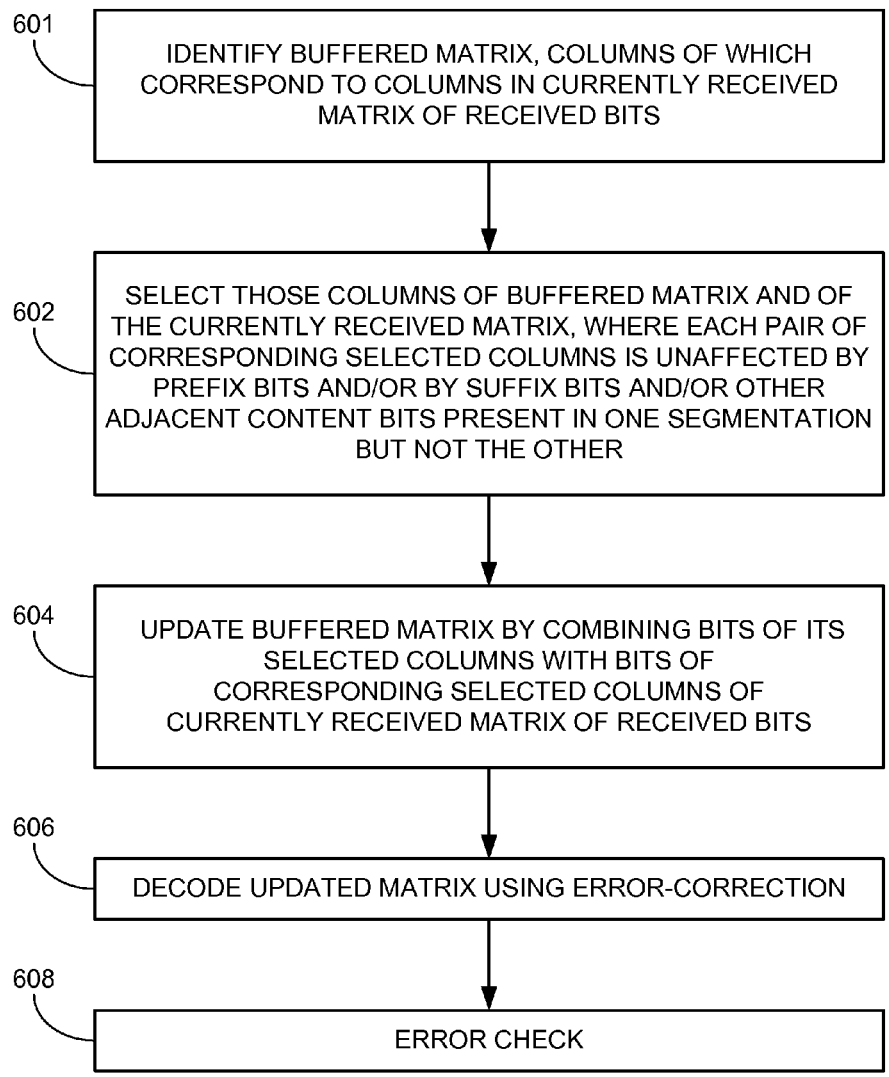
FIG. 6 is a flowchart of another exemplary method that may be implemented in a combiner, a decoder and an error checker.

FIG. 6 is a flowchart of another exemplary method that may be implemented in combiner 126, decoder 130 and error checker 132. At 601, combiner 126 identifies which buffered matrix has columns that correspond to columns in a currently received matrix of received bits. The correspondence of columns arises from the columns being related to the same bits of digital content. At 602, combiner 126 selects columns of the buffered matrix and of the currently received matrix of received bits, where each pair of corresponding selected columns is unaffected by prefix bits and/or by suffix bits and/or by other adjacent content bits present in one segmentation but not the other. At 604, combiner 126 updates the buffered matrix by combining bits of its selected columns with the bits of corresponding selected columns of the currently received matrix. At 606, the updated matrix is decoded using error-correction by decoder 130. At 608, error checker 132 checks whether decoder 130 has successfully decoded the update matrix.

Figure 7:
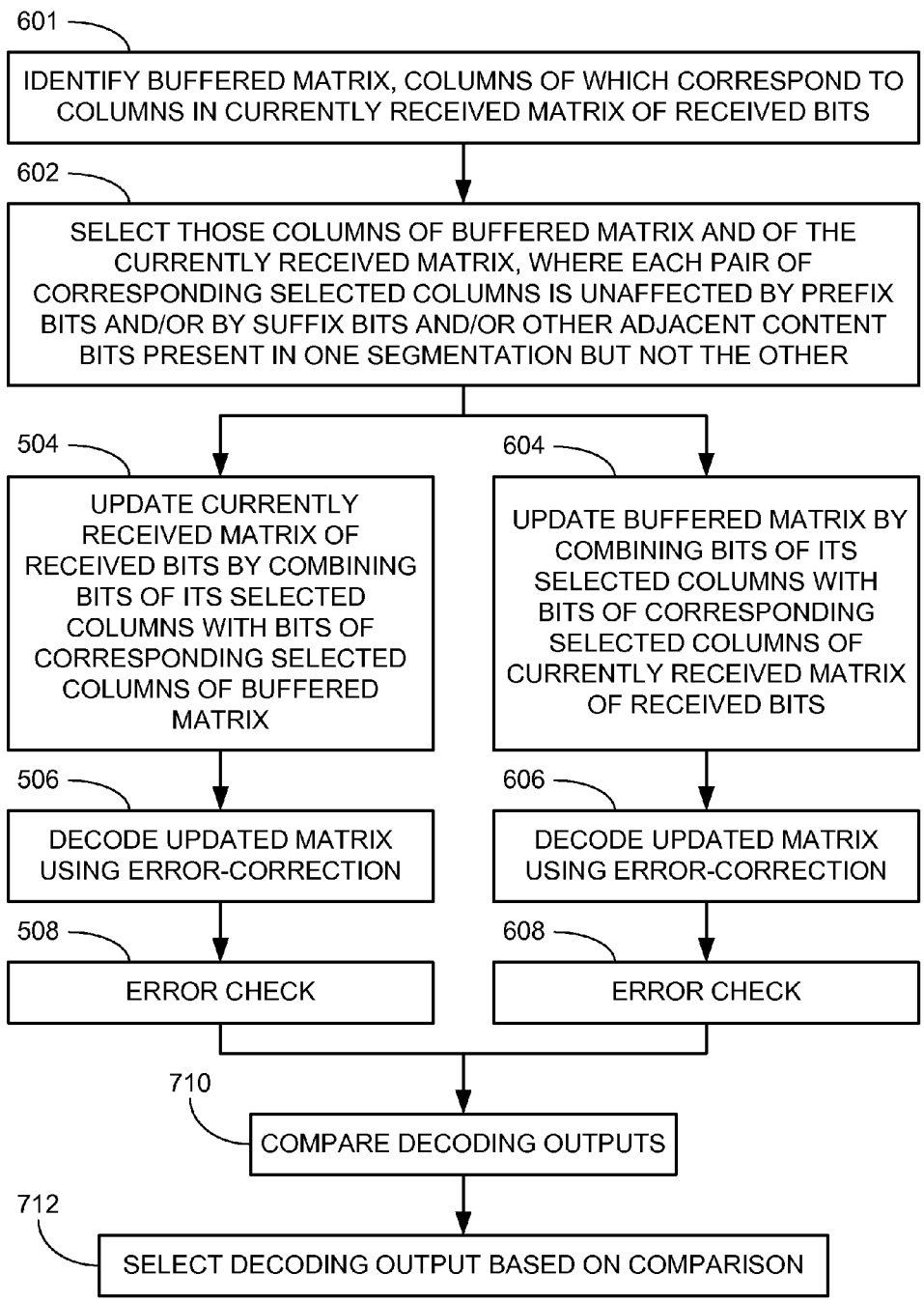
FIG. 7 is a flowchart of yet another exemplary method that may be implemented in a combiner, a decoder and an error checker.

FIG. 7 is a flowchart of yet another exemplary method that may be implemented in combiner 126, decoder 130 and error checker 132. This method involves updating the currently received matrix, decoding the updated received matrix and error checking as described above with respect to the method of FIG. 5, and updating the buffered matrix and decoding the updated buffered matrix, and error checking as described above with respect to the method of FIG. 6. At 710, station 104 may then compare the decoding outputs. At 712, station 104 may select the decoding output that, according to the comparison, has the best results. An example of a metric for determining the best results is which result enables more bits of the received data to be successfully decoded. Specifically, the metric may be which result advances the sliding window the most.

An example of how to identify columns that can be combined is as follows. Given two input blocks, A and B, to the encoder 112, where A is a string of M bits $a_0, a_1, \ldots, a_{M-1}$, and B is a string of N bits $b_0, b_1, \ldots, b_{N-1}$, and each block is analogous to block 300 in FIG. 3, and there exists a common substring of L bits, L at least as large as constraint length K, starting at index i in block A and index j in block B, then the bits in column i+K-1+h of the encoded matrix for A and the bits in column j+K-1+h of the encoded matrix for B can be combined, for h running from 0 to L-K. Each of the encoded matrices is analogous to matrix 302 in FIG. 3.

The example of encoder 112 using a convolutional code without recursiveness has been described. However, the technical description provided above is also applicable, with certain modifications, to systems in which encoder 112 uses a turbo code. Turbo codes use recursive convolutional codes but also send systematic bits which are semi-static during retransmissions. Referring again to FIG. 3, it was stated above that in general, the value of the $m^{th}$ bit in block 300 affects the values of the output bits in columns m through m+K-J of matrix 302, where m is an index that runs from 0 to N-1. Specifically in the case of turbo codes, the $m^{th}$ bit in block 300 affects different rows of matrix 302 in different ways. On the recursive rows, the $m^{th}$ bit affects output bits in all of the column positions. On the systematic rows, the $m^{th}$ bit affects only the bit at column m. Therefore, the exemplary matrices shown in FIGS. 4A and 4B and the accompanying description are applicable to turbo codes if it is assumed that the matrices contain only systematic rows (the recursive rows having been stripped out) and that the constraint length K is 1. Combining bits of received blocks after depuncturing prior to decoding therefore ought to be applied only to systematic bits (i.e. bits of the systematic rows, but not necessarily all of the bits of the systematic rows). The recursive bits (i.e. bits of the recursive rows, but not necessarily all of the bits of the recursive rows) used along with the updated systematic bits in the decoding may be obtained either from the initial transmission or from the retransmission. It is also possible to decode twice—once with the recursive bits from the initial transmission and once with recursive bits from the retransmission, to compare the decoding outputs, and to select the decoding output that has the best results. An example of a metric for determining the best results is which result enables more bits of the received data to be successfully decoded. Specifically, the metric may be which result advances the sliding window the most. When an initial transmission is not successfully decoded and resegmentation occurs at the sending entity, the sending entity may transmit only the new recursive bits and only the systematic bits which could not already be in the receiver's buffer from a previous segmentation.

The example of how to identify columns that can be combined, provided above, applies in the case of turbo codes if one considers for combining only the bits on the systematic rows of the encoded matrices and one takes K to be 1 for those rows.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method comprising:
   receiving different transmissions based on different content blocks which were segmented from a common digital content according to different block segmentation schemes, where for each one of the different content blocks, a substring in that one of the different content blocks is identical to a substring in at least one other of the different content blocks;
   deriving received bits from the different transmissions, the received bits resulting from encoding according to a turbo code;
   combining into combined bits a subset of the received bits that are systematic bits, that relate to the substring, and that are derived from different ones of the different transmissions; and
   providing to a decoder, together with the combined bits, some of the received bits that are not included in the subset.

2. A method comprising:
   a) receiving a first transmission and deriving first received bits from the first transmission, wherein the first received bits would be identical to first encoded bits resulting from encoding of a first content block which was segmented from digital content according to a first block segmentation scheme, if not for any one or any combination of the following having occurred:
      i) first prefix bits or first suffix bits or both being appended to the first content block prior to the encoding thereof;
      ii) puncturing of the first encoded bits prior to transmission of the first transmission; and
      iii) any errors being introduced during transmission of the first transmission;
   b) after receiving said first transmission, receiving a second transmission and deriving second encoded received bits from the second transmission, wherein the second received bits would be identical to second encoded bits resulting from encoding of a second content block which was segmented from the digital content according to a second block segmentation scheme that differs from the first block segmentation scheme, if not for any one or any combination of the following having occurred:
  i) second prefix bits or second suffix bits or both being appended to the second content block prior to the encoding thereof;
  ii) puncturing of the second encoded bits prior to transmission of the second transmission; and
  iii) any errors being introduced during transmission of the second transmission;
c) combining into combined bits a subset of the first received bits and a subset of the second received bits, wherein the first content block and the second content block are not identical, a substring in the first content block is identical to a substring in the second content block, and the first received bits that are combined into the combined bits relate to the same bits of the substring as the second received bits that are combined into the combined bits; and
d) providing to a decoder, together with the combined bits, those of the first received bits that were not combined.

3. The method of claim 2, wherein the second content block is wholly contained in the first content block, a third content block, which was segmented from the digital content according to the second block segmentation scheme, is wholly contained in the first content block, and the first content block is identical to a concatenation of the second content block and the third content block.

4. The method of claim 2, wherein the first prefix bits and the first suffix bits are appended to the first content block prior to the encoding thereof, and the second prefix bits and the second suffix bits are appended to the second content block prior to the encoding thereof, the method further comprising:
selecting as the subset of the first received bits to be combined those first received bits that are unaffected by the first prefix bits, unaffected by the first suffix bits and unaffected by any content bits that are not common to the first content block and the second content block; and
selecting as the subset of the second received bits to be combined those second received bits that are unaffected by the second prefix bits, unaffected by the second suffix bits and unaffected by any content bits that are not common to the first content block and the second content block.

5. The method of claim 2, further comprising:
providing those of the second received bits that were not combined, together with the combined bits, to the decoder; and
determining whether to use output of the decoder resulting from providing those of the first received bits that were not combined, together with the combined bits, to the decoder or output of the decoder resulting from providing those of the second received bits that were not combined, together with the combined bits, to the decoder.

6. The method of claim 2, wherein the first content block is wholly contained in the second content block.

7. The method of claim 2, wherein the second content block is wholly contained in the first content block.

8. The method of claim 2, wherein the first content block is not wholly contained in the second content block and the second content block is not wholly contained in the first content block.

9. The method of claim 2, wherein the received bits are soft decision bits.

10. The method of claim 2, wherein the received bits are hard decision bits.

11. The method of claim 2, wherein the encoding is according to a convolutional code without recursiveness.

12. The method of claim 2, wherein the encoding is according to a turbo code and the received bits combined into the combined bits are systematic bits.

13. A method comprising:
a) receiving a first transmission and deriving first received bits from the first transmission, wherein the first received bits would be identical to first encoded bits resulting from encoding of a first content block which was segmented from digital content according to a first block segmentation scheme, if not for any one or any combination of the following having occurred:
  i) first prefix bits or first suffix bits or both being appended to the first content block prior to the encoding thereof;
  ii) puncturing of the first encoded bits prior to transmission of the first transmission; and
  iii) any errors being introduced during transmission of the first transmission;
b) receiving a second transmission and deriving second received bits from the second transmission, wherein the second received bits would be identical to second encoded bits resulting from encoding of a second content block which was segmented from the digital content according to a second block segmentation scheme that differs from the first block segmentation scheme, if not for any one or any combination of the following having occurred:
  i) second prefix bits or second suffix bits or both being appended to the second content block prior to the encoding thereof;
  ii) puncturing of the second encoded bits prior to transmission of the second transmission; and
  iii) any errors being introduced during transmission of the second transmission;
c) combining into combined bits a subset of the first received bits and a subset of the second received bits, wherein the first content block and the second content block are not identical, a substring in the first content block is identical to a substring in the second content block, the first content block is not wholly contained in the second content block, the second content block is not wholly contained in the first content block, and the first received bits that are combined into the combined bits relate to the same bits of the substring as the second received bits that are combined into the combined bits; and
d) providing to a decoder, together with the combined bits, those of the second received bits that were not combined.

14. The method of claim 13, wherein the first prefix bits and the first suffix bits are appended to the first content block prior to the encoding thereof, and the second prefix bits and the second suffix bits are appended to the second content block prior to the encoding thereof, the method further comprising:
selecting as the subset of the first received bits to be combined those first received bits that are unaffected by first prefix bits, unaffected by first suffix bits and unaffected by any content bits that are not common to the first content block and the second content block; and
selecting as the subset of the second received bits to be combined those second received bits that are unaffected by the second prefix bits, unaffected by the second suffix bits and unaffected by any content bits that are not common to the first content block and the second content block.

15. The method of claim 13, further comprising:
providing those of the first received bits that were not combined, together with the combined bits, to the decoder; and determining whether to use output of the decoder resulting from providing those of the first received bits that were not combined, together with the combined bits, to the decoder or output of the decoder resulting from providing those of the second received bits that were not combined, together with the combined bits, to the decoder.

16. The method of claim 13, wherein the received bits are soft decision bits.

17. The method of claim 13, wherein the received bits are hard decision bits.

18. The method of claim 13, wherein the encoding is according to a convolutional code without recursiveness.

19. The method of claim 13, wherein the encoding is according to a turbo code and the received bits combined into the combined bits are systematic bits.

20. The method of claim 13, wherein the first transmission is received before the second transmission.

21. The method of claim 13, wherein the second transmission is received before the first transmission.

22. A method comprising:
  a) receiving a first transmission and deriving first received bits from the first transmission, wherein the first received bits would be identical to first encoded bits resulting from encoding of a first content block which was segmented from digital content according to a first block segmentation scheme, if not for any one or any combination of the following having occurred:
    i) first prefix bits or first suffix bits or both being appended to the first content block prior to the encoding thereof;
    ii) puncturing of the first encoded bits prior to transmission of the first transmission; and
    iii) any errors being introduced during transmission of the first transmission;
  b) receiving a second transmission and deriving second received bits from the second transmission, wherein the second received bits would be identical to second encoded bits resulting from encoding of a second content block which was segmented from the digital content according to a second block segmentation scheme that differs from the first block segmentation scheme, if not for any one or any combination of the following having occurred:
    i) second prefix bits or second suffix bits or both being appended to the second content block prior to the encoding thereof;
    ii) puncturing of the second encoded bits prior to transmission of the second transmission; and
    iii) any errors being introduced during transmission of the second transmission;
  c) combining into combined bits a subset of the first received bits and a subset of the second received bits, wherein the first content block and the second content block are not identical, a substring in the first content block is identical to a substring in the second content block, the first content block is wholly contained in the second content block, and the complement of the first content block in the second content block is not contiguous in the second content block, and the first received bits that are combined into the combined bits relate to the same bits of the substring as the second received bits that are combined into the combined bits; and
  d) providing to a decoder, together with the combined bits, either those of the first received bits that were not combined or those of the second received bits that were not combined.

23. The method of claim 22, wherein the first prefix bits and the first suffix bits are appended to the first content block prior to the encoding thereof, and the second prefix bits and the second suffix bits are appended to the second content block prior to the encoding thereof, the method further comprising:
  selecting as the subset of the first received bits to be combined those first received bits that are unaffected by first prefix bits, unaffected by first suffix bits and unaffected by any content bits that are not common to the first content block and the second content block; and
  selecting as the subset of the second received bits to be combined those second received bits that are unaffected by the second prefix bits, unaffected by the second suffix bits and unaffected by any content bits that are not common to the first content block and the second content block.

24. The method of claim 22, wherein those of the first received bits that were not combined were provided, together with the combined bits, to the decoder, the method further comprising:
  providing those of the second received bits that were not combined, together with the combined bits, to the decoder; and
  determining whether to use output of the decoder resulting from providing those of the first received bits that were not combined, together with the combined bits, to the decoder or output of the decoder resulting from providing those of the second received bits that were not combined, together with the combined bits, to the decoder.

25. The method of claim 22, wherein the received bits are soft decision bits.

26. The method of claim 22, wherein the received bits are hard decision bits.

27. The method of claim 22, wherein the encoding is according to a convolutional code without recursiveness.

28. The method of claim 22, wherein the encoding is according to a turbo code and the received bits combined into the combined bits are systematic bits.

29. The method of claim 22, wherein the first transmission is received before the second transmission.

30. The method of claim 22, wherein the second transmission is received before the first transmission.

31. The method of claim 22, wherein those of the second received bits that were not combined were provided, together with the combined bits, to the decoder, the method further comprising:
  providing those of the first received bits that were not combined, together with the combined bits, to the decoder; and
  determining whether to use output of the decoder resulting from providing those of the first received bits that were not combined, together with the combined bits, to the decoder or output of the decoder resulting from providing those of the second received bits that were not combined, together with the combined bits, to the decoder.

* * * * *